(12) United States Patent
Hwang et al.

(10) Patent No.: US 12,008,303 B2
(45) Date of Patent: Jun. 11, 2024

(54) CELL OVERLAP VIOLATION DIAGNOSTICS WITH MACHINE LEARNING

(71) Applicant: Synopsys, Inc., Mountain View, CA (US)

(72) Inventors: Leslie K. Hwang, Chandler, AZ (US); Srinivasa R. Arikati, San Jose, CA (US)

(73) Assignee: Synopsys, Inc., Sunnyvale, CA (US)

( * ) Notice: Subject to any disclaimer, the term of this patent is extended or adjusted under 35 U.S.C. 154(b) by 319 days.

(21) Appl. No.: 17/411,876

(22) Filed: Aug. 25, 2021

(65) Prior Publication Data

US 2022/0067265 A1 Mar. 3, 2022

Related U.S. Application Data

(60) Provisional application No. 63/072,069, filed on Aug. 28, 2020.

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
USPC .......................... 716/110, 111, 112, 118, 119
See application file for complete search history.

(56) References Cited

U.S. PATENT DOCUMENTS

| | | | |
|---|---|---|---|
| 6,011,911 A | 1/2000 | Ho et al. | |
| 6,397,373 B1 | 5/2002 | Tseng et al. | |
| 9,032,339 B2 | 5/2015 | De et al. | |
| 2010/0192113 A1 | 7/2010 | Brelsford et al. | |
| 2018/0121594 A1* | 5/2018 | Studders | G06F 30/398 |

FOREIGN PATENT DOCUMENTS

CN 109923542 A * 6/2019 ......... G06F 17/5022

* cited by examiner

*Primary Examiner* — Brian Ngo
(74) *Attorney, Agent, or Firm* — Patterson + Sheridan, LLP

(57) ABSTRACT

A method for identifying design rule checking (DRC) violation types within an integrated circuit (IC) chip design includes receiving an IC chip design layout, and performing a DRC process on the IC chip design layout to identify DRC violations. Further, the method includes generating clustered heatmaps from heatmaps generated from the DRC violations. The method further includes identifying a first DRC violation type and a corresponding first cell pair within the IC chip design layout by analyzing the clustered heatmaps with a diagnostic model.

20 Claims, 9 Drawing Sheets

CELL OVERLAP VIOLATION DIAGNOSTICS WITH MACHINE LEARNING

RELATED APPLICATION

This application claims the benefit of United States provisional patent application Ser. No. 63/072,069, filed Aug. 28, 2020, which is hereby incorporated herein by reference.

TECHNICAL FIELD

The present disclosure relates to detecting and diagnosing errors within an integrated circuit chip design during an integrated circuit layout validation process.

BACKGROUND

During a layout validation phase of an integrated circuit (IC) design process, a large number of design rule checking (DRC) error reports result in a large number of debugging tasks to be performed, increasing the design time cycle. The debugging tasks include having an administrator reviewing each of the errors and identifying the cause of the errors prior to making layout changes to correct the each of errors. After a set of the layout changes, additional iterative validation processes are completed. Such an interactive process takes considerable amount of time and design cycles, and computer processor resources. Especially, the detected DRC errors are reported in a low, physical level of the IC chip design, a potential small-scale fix may result in a large set of cascading changes. Accordingly, to correct the DRC errors, an administrator often makes higher-level corrections to the hierarchical and inter-dependent layout of the IC chip design to minimize the tasks.

SUMMARY

In one example, a method for identifying design rule checking (DRC) violation types within an integrated circuit (IC) chip design includes receiving an IC chip design layout, and performing a DRC process on the IC chip design layout to identify DRC violations. Further, the method includes generating clustered heatmaps from heatmaps generated from the DRC violations. The method further includes identifying a first DRC violation type and a corresponding first cell pair within the IC chip design layout by analyzing the clustered heatmaps with a diagnostic model.

In one example, a system includes a memory and a processor. The memory stores instructions and the processor is coupled with the memory and executes the instructions to receive an IC chip design layout. The processor further performs a DRC process on the IC design layout to identify DRC violations, and generates clustered heatmaps from heatmaps generated from the DRC violations. Further, the processor identifies a first DRC violation type and a corresponding first cell pair within the IC chip design layout by analyzing the clustered heatmaps with a diagnostic model.

In one example, a non-transitory computer readable medium comprises stored instructions, which when executed by a processor, cause the processor to receive an IC design layout, and perform a DRC process on the IC design layout to identify DRC violations. The processor is further caused to determine an error distribution across the IC design layout based on the DRC violations. Further, the processor is caused to identify a first DRC violation type and a corresponding first cell pair within the IC design layout based on the error distribution across the IC design layout.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to cell overlap violation diagnostics with machine learning.

The layout validation phase of an integrated circuit (IC) chip design includes a physical verification process. The physical verification process includes performing a design rule checking (DRC) process to identify DRC violations. Further, during the physical verification process, the DRC violations (errors) are corrected (fixed). In many instances, the amount of time spent by an administrator (user) to correct the DRC violations is considerable, increasing the overall amount of time spent during the IC chip design process and the amount of computer resources used during the layout validation phase for an IC chip design. In some examples, the detected DRC violations are reported in a low, physical level of the IC chip design, as such, a potential small-scale fix may result in a large set of cascading changes. Accordingly, to correct for the DRC violation, an administrator makes corrections in the high, hierarchical level to the inter-dependent layout of the IC chip design to minimize the tasks. Therefore, the low, physical level of DRC error is translated to a high, hierarchical level of DRC violation type. Such analysis and corrections are time, cycle, and computer resource intensive as an administrator reviews each DRC violation, identify the root cause and potential fix and adjusts the IC chip design to correct for each DRC violation. To reduce the amount of time or design cycles spent and the amount of computer resources used during the physical verification process, a diagnostic process is applied to the DRC violations, to guide a user in correcting the DRC violation. For example, a cell overlap diagnostic process is utilized to guide the corrections made to the IC chip design. A cell is a logical or functional unit built from various components. The diagnostic process is applied to identify violation types within an IC design that result from cell overlap or other violations using one or more error density distribution maps (e.g., a heatmaps). The diagnostic process identifies which cells correspond to which DRC violation, outputting cell pair names and locations of the violations. Accordingly, an administrator can apply corrections to the identified cells without manually reviewing each DRC violation and the details of the IC chip design that may have led to the DRC violations. The following diagnostic improves the IC chip design debugging time by diagnosing and identifying DRC violations and communicating the identified DRC violations and corresponding cells to an administrator for corrective action. Further, the following diagnostic process improves how a computer system is used to perform the layout validation phase, including identifying and reporting DRC violations and associated cells within an IC chip design.

Figure 1A:
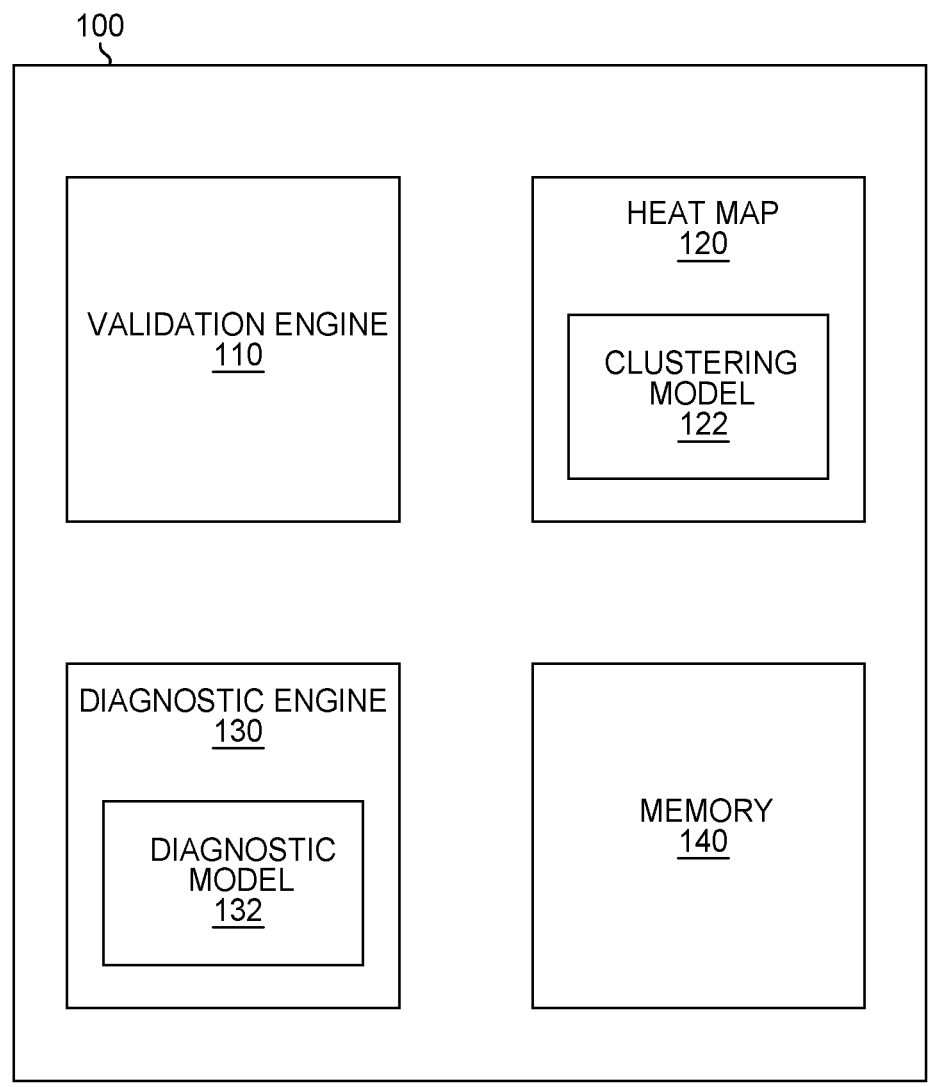
FIG. 1A depicts schematic block diagram of an error validation system, according to one or more examples.

FIG. 1A illustrates a block diagram of an error validation system 100, according to one or more examples. The error validation system 100 includes one or more processors (e.g., the processing device 802 of FIG. 8) that execute instructions (e.g., the instructions 26 of FIG. 8) stored a non-transitory memory (e.g., the main memory 804 or the machine-readable medium 824 of FIG. 8) to receive an IC design layout and identify DRC violations (e.g., errors). The error validation system 100 generates heatmaps from the identified DRC violations and clusters the heatmaps. The error validation system 100 further classifies the violation types associated with one or more design rule checking (DRC) violations from the clustered heatmaps. The DRC includes design rules that correspond to the instrument specifications used during manufacturing, the manufacturing technology node, and/or manufacturing limitations, among others. In one example, the design rules include minimum width, spacing, and alignments of the circuit blocks and traces.

The error validation system 100 includes a validation engine 110, a heatmap engine 120, a diagnostic engine 130, and a memory 140. The memory is a non-transitory memory. For example, the memory 140 is similar to the main memory 804 or the machine-readable medium 824 of FIG. 8.

Figure 8:
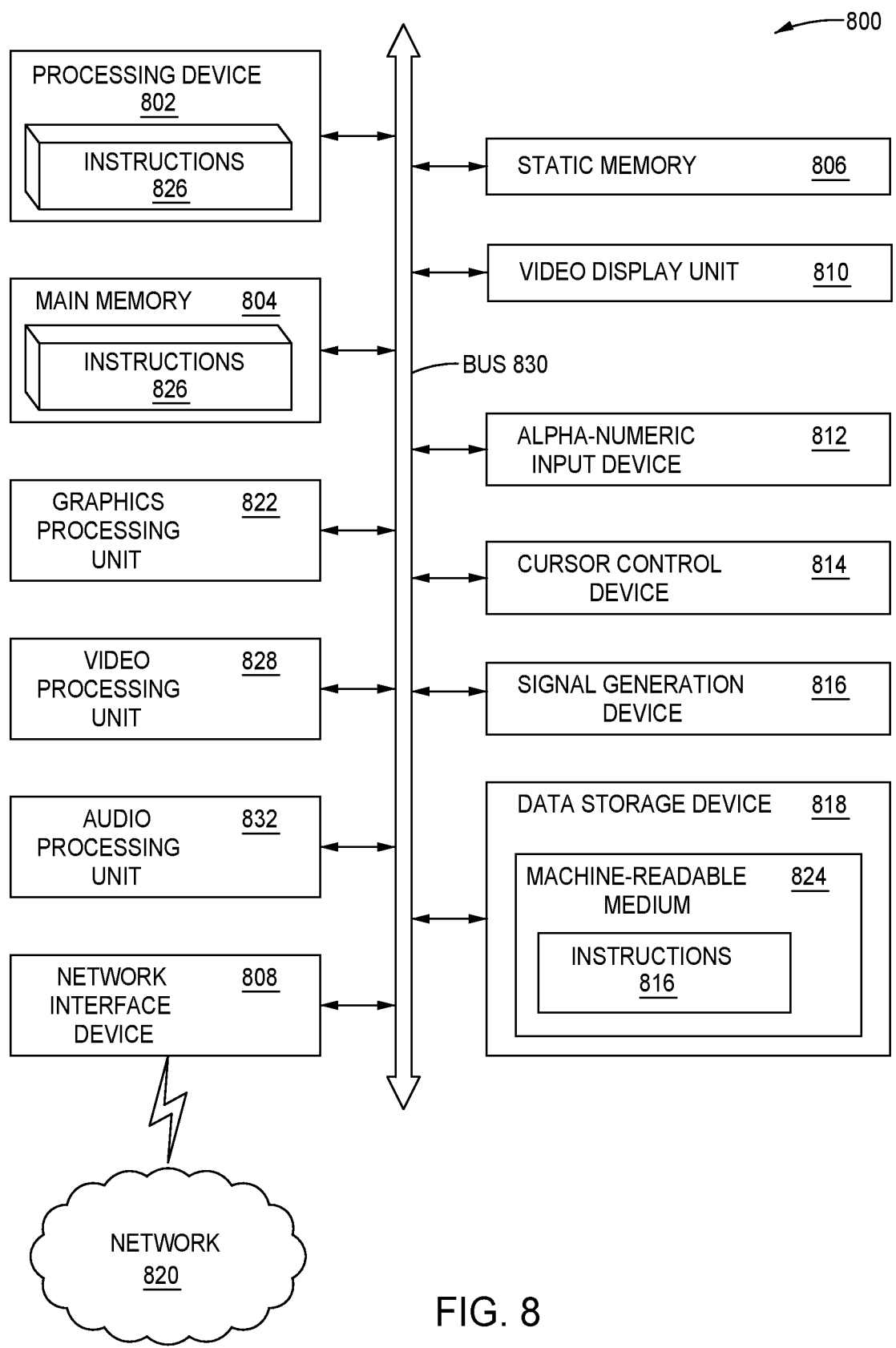
FIG. 8 depicts an abstract diagram of an example computer system in which embodiments of the present disclosure may operate.

The validation engine 110 includes one or more processors (e.g., the processing device 802 of FIG. 8) that execute instructions (e.g., the instructions 826 of FIG. 8) stored in a non-transitory memory (e.g., the memory 140, the main memory 804 of FIG. 8, or the machine-readable medium 824 of FIG. 8). The validation engine 110 receives an IC design layout and performs DRC validation on the IC design layout. For example, the validation engine 110 applies one or more DRC rules (e.g., runset) to the IC design layout to identify DRC violations (or DRC errors) within the IC design layout.

The validation engine 110 stores the identified DRC violations in the memory 140. Additionally, or alternatively, the validation engine 110 communicates the DRC violations to the heatmap engine 120.

The heatmap engine 120 includes one or more processors (e.g., the processing device 802 of FIG. 8) that execute instructions (e.g., the instructions 826 of FIG. 8) stored in a non-transitory memory (e.g., the memory 140, the main memory 804 of FIG. 8, or the machine-readable medium 824 of FIG. 8). The heatmap engine 120 access the memory 140 to acquire the DRC violations. Additionally, or alternatively, the heatmap engine 120 receives the DRC violations from the validation engine 110.

The heatmap engine 120 generates heatmaps, e.g., an error density map, from the DRC violations. A heatmap illustrates a corresponding DRC error distribution across the corresponding IC design layout. The heatmap engine 120 applies a clustering model 122 to the DRC violations to cluster the DRC violations. Clustering the heatmaps groups DRC violation rules with a similar violation root cause (e.g., violation type). In one example, DRC violations reported to be in a similar location within the IC design layout are determined to be from the same root cause (e.g., same error within the IC design layout) that violates multiple design rules.

In one example, the clustering model 122 includes a clustering algorithm that groups (clusters) the heatmaps with a similar polygon, shape or pattern. In one example, clustering model 122 can group heatmaps based on the type of DRC rules with similar heatmap pattern. In one example, the clustering algorithm is a K-means clustering algorithm. In other examples, other clustering algorithms, such as hierarchical, agglomerative, fuzzy C-means, or Gaussian Mixed Models are utilized. In one example, multiple clustering algorithms (e.g., K-means algorithms and/or other clustering algorithms) in combination with several different parameter values are applied and compared using silhouette score (e.g., coefficient). A silhouette score is a metric used to calculate how well a clustering technique classifies each object (e.g., polygon, shape, or pattern).

In one example, the number of clusters of clustered heatmaps correlates to the number of rules of the DRC. For example, as the number of design rules increases, the number of clusters of clustered heatmaps increases. In one example, the maximum number of clusters is 25. In other examples, the maximum number of clusters is greater than or less than 25 adjusted based on the DRC rules in the runset.

The heatmap engine 120 stores the clustered heatmaps in the memory 140. Additionally, or alternatively, the heatmap engine 120 provides the clustered heatmaps to the diagnostic engine 130.

The diagnostic engine 130 includes one or more processors (e.g., the processing device 802 of FIG. 8) that execute instructions (e.g., the instructions 826 of FIG. 8) stored in a non-transitory memory (e.g., the memory 140, the main memory 804 of FIG. 8, or the machine-readable medium 824 of FIG. 8). The diagnostic engine 130 accesses the memory 140 to acquire the clustered heatmaps. Additionally, or alternatively, the diagnostic engine 130 receives the clustered heatmaps from the heatmap engine 120.

The diagnostic engine 130 analyzes the clustered heatmaps to identify one or more DRC violation types. For example, the diagnostic engine 130 analyzes the clustered heatmaps to identify cell overlap. In other example, the diagnostic engine 130 analyzes the clustered heatmaps to identify via violations, blockage violations, block overlap violations, missing block violations and/or fill overlap violations, among other DRC violations.

Figure 1B:
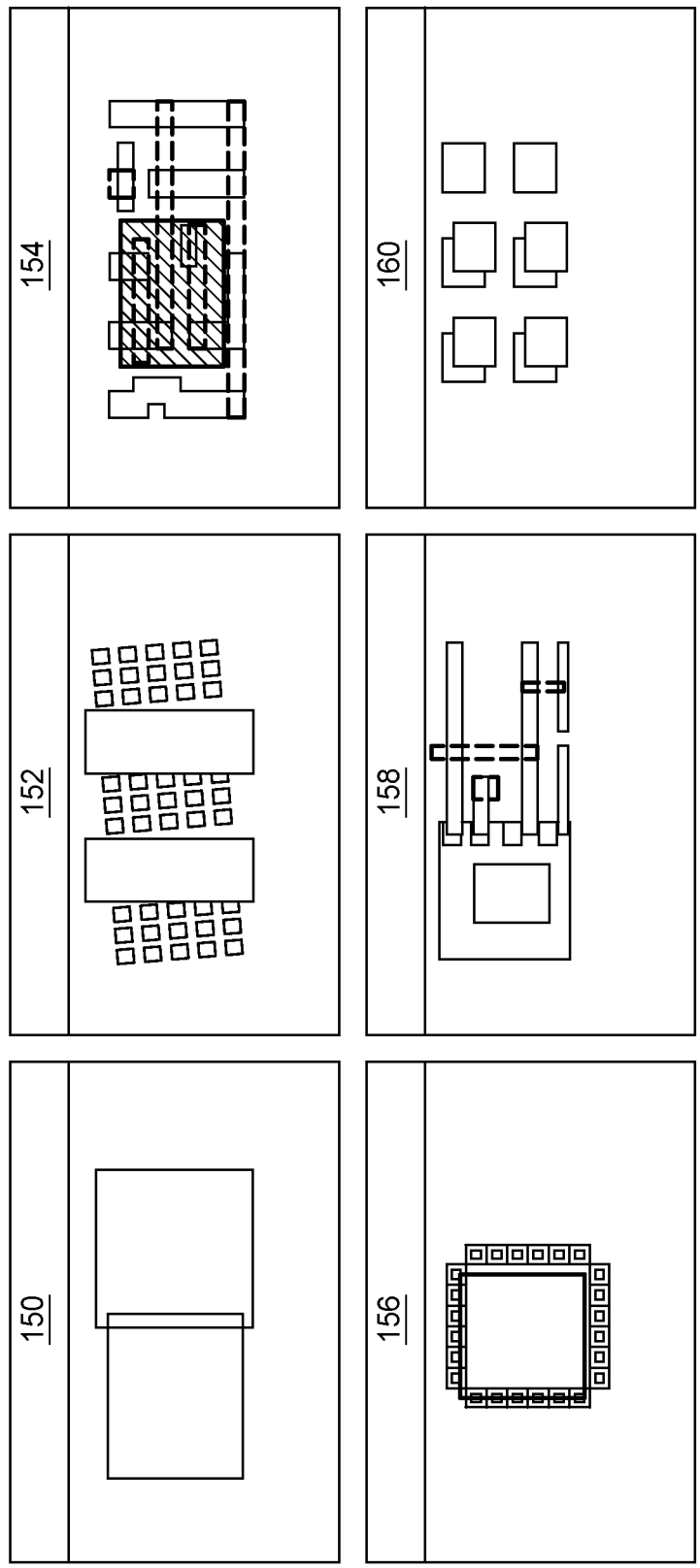
FIG. 1B depicts various violation types, according to one or more examples.

FIG. 1B illustrates various DRC violation types (e.g., root causes). DRC violation type 150 is a block overlap violation type due to incorrect block alignment during integration. DRC violation type 152 is a fill overlap violation type and is due to overlapping fill due to a methodology issue. DRC violation type 154 is a missing blockage violation type and is due to block issues before fill. DRC violation type 156 is a pad ring overlap violation type and is due to pad ring placement issues lead to overlap with core area. DRC violation type 158 is a pin location mismatch violation type and is due to late state revisions leading to pin location mismatch. DRC violation type 160 is a via overlap violation type and is due to a via cut duplication and overlap.

The diagnostic engine 130 applies a diagnostic model 132 to the clustered heatmaps to identify the corresponding violation type. The diagnostic model 132 corresponds to the type of violation that is to be identified. For example, in examples where the diagnostic model 132 is used to identify cell overlap, the diagnostic model 132 is a cell overlap model. A classification model can be used for diagnostic model 132, such as Support Vector Machine, Random Forest, K-Nearest Neighbors. In other examples, Deep Neural Network, Generative Adversarial Nets are used for diagnostic model 132. In one example, features used to train diagnostic model include the heatmap, coordinates of cell overlap region, coordinates of violation region, areas of overlapping cells, cell overlap area, ratio of cell overlap to violation region, and DRC violation rule types, among others.

In one example, the diagnostic model 132 is trained based on IC design layouts having one or more DRC violations. The IC design layouts have different types of the DRC violation. Further, the IC design layouts used to train the diagnostic model 132 correspond to a corresponding manufacturing process. For example, the DRC violation or violations of the IC design correspond to the requirements and/or parameters of a corresponding manufacturing process. In one example, the diagnostic engine 130 applies the diagnostic model 132 to the heatmaps to detect cell overlap violations. In such an example, the diagnostic engine 130 trains the diagnostic model 132 using IC design layouts having different types of cell overlap.

The diagnostic engine 130 applies a random forest classifier, or another type of classifier additionally, or alternatively deep neural network, to train the diagnostic model 132. For example, the diagnostic engine 130 applies a classifier to classify DRC violations of each IC design layout of the training set of a plurality of example IC design layouts. The IC design layouts of the training set include example DRC violation types corresponding to the DRC violations to be identified by the diagnostic model 132. The diagnostic model 132 is trained to identify one or more DRC violation types based on the IC design layouts of the training set. Real industry layouts with violations or manually generated layouts with corresponding DRC violations are used for the training dataset. To apply classification algorithm, each violation type is determined and labeled to train the model for further diagnosis. In one example, a random forest classifier is applied and hyperparameters, such as number of estimators, maximum depth of decision trees, initial random state, among others, are tuned to increase the accuracy of classification. In another example, deep neural network is applied and hyperparameters, such as learning rate, number of hidden layers, batch size, among others, are tuned to increase the accuracy of classification while not exceeding the timeframe parameter.

In one example, the diagnostic engine 130 evaluates one or more hyperparameters to train the classifier for the diagnostic model 132. The hyperparameters determine the accuracy, runtime, and/or performance of the classifier when training the diagnostic model 132. The hyperparameters correspond to classifier which the diagnostic model 132 is trained to classify the DRC violation or violations. While training the diagnostic model 132, different combinations of hyperparameters are tuned and compared for increased accuracy while not exceeding a timeframe parameter. The timeframe parameters correspond to the amount time spent training the diagnostic model 132. The timeframe parameter may be provided by an administrator (e.g., user). In one example, the diagnostic model 132 is cross-validated between training and testing datasets to extract the set of hyperparameters that increases performance of the diagnostic model 132.

The diagnostic model 132 may be customized based on more frequently occurring corresponding DRC violation cases for a specific designer, semiconductor manufacturer, and/or manufacturing process. Further, the diagnostic model 132 is updated based on unseen DRC violation patterns. Unseen violation patterns are provided by an administrator or generated with random cell placements and/or relocation. In one or more examples, the diagnostic model 132 is re-trained based on a new design set including new DRC violation patterns that are detected during process of an IC chip design.

In one specific example, the diagnostic engine 130 applies a classifier to train the diagnostic model 132 to identify cell overlap. In such an example, features are selected from a group consisting of heatmap polygon area, heatmap polygon locations, cell overlapping area, cell pairs, cell locations, heatmap polygon overlap percentage, number of violation rules, violation rule types, and/or number of spacing rules, among others.

In one example, the diagnostic engine 130 applies the diagnostic model 132 to clustered heatmaps to identify (e.g., diagnose) the violation types. The identified violation types are stored in the memory 140. Further, the identified violation types are output via a display device (e.g., a video display unit 810 illustrated in FIG. 8). Additionally, or alternatively, the identified violation types are output to another computer system or engine of the error validation system 100.

Figure 2:
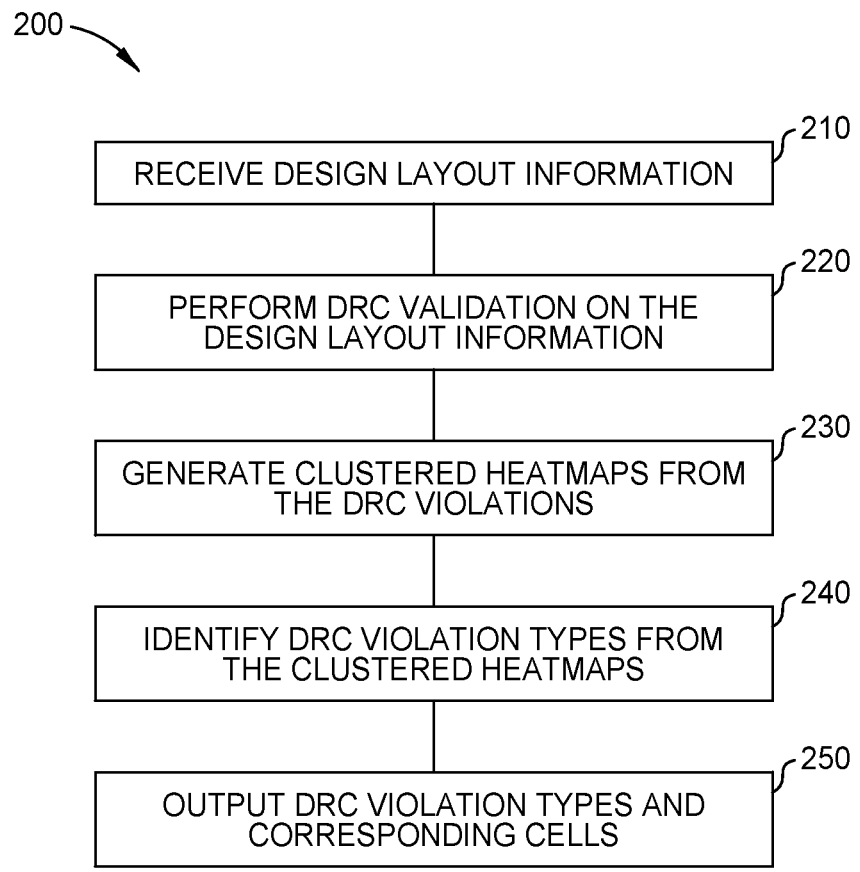
FIG. 2 depicts a flowchart of a method for identifying design rule checking violations, according to one or more examples.

FIG. 2 illustrates a flowchart of a method 200 for identifying DRC violations within an IC chip design. The method 200 is performed by the error validation system 100. For example, one or more processors (e.g., the processing device 802 of FIG. 8) of the error validation system 100 execute instructions (e.g., the instructions 826 of FIG. 8) stored in a non-transitory memory (e.g., the memory 140 of FIG. 1A, the main memory 804 of FIG. 8, or the machine-readable medium 824 of FIG. 8) to perform the method 200. The method 200 is performed as part of the processes 700 of FIG. 7 used during the design, verification, and fabrication of an integrated circuit to transform and verify design data and instructions that represent the integrated circuit. For example, the method 200 may be performed as part of the physical verification process 728 of processes 700 of FIG. 7.

In one example, the method 200 improves the IC chip design layout validation phase process performed by a computer system by reducing the corresponding processor resources and cost, and allowing more IC chip design layout validation processes to be completed in a corresponding time frame and/or by a corresponding computer system.

Further, the following diagnostic process improves how a computer system is used to perform the layout validation phase, including identifying and reporting DRC violation types and associated cells and/or other components within an IC chip design.

At block 210, digital design layout information is received. The digital design layout information is an IC chip design layout. The digital design layout information includes the layout of an IC design and the corresponding design rules (e.g., runset). In one example, the error validation system 100 receives design layout information. In another example, the validation engine 110 receives the design layout information. The validation engine 110 accesses the memory 140 to acquire the design layout information stored within the memory 140.

At block 220, DRC validation is performed on the digital design layout information. One or more processors (e.g. the processing device 802 of FIG. 8) of the validation engine 110 executes instructions (e.g., the instructions 826 of FIG. 8) stored in a non-transitory memory (e.g., the memory 140 of FIG. 1A, the main memory 804 of FIG. 8, or the machine-readable medium 824 of FIG. 8) to perform the block 220. The validation engine 110 performs DRC validation on the IC design layout by applying one or more design rules to the IC design layout. Performing DRC validation detects DRC violations (e.g., errors) within the IC design layout. The DRC violations correspond to exceeding a minimum width between cells within the IC chip design, violating spacing requirements of cells within the IC chip design, violating alignment requirements of cells within the IC chip design, exceeding a minimum area requirement within the IC chip design, misaligned via wires within the IC chip design, exceeding special notch spacing within the IC chip design, and/or exceeding end of line space within the IC chip design, among others. The DRC rules corresponds to the semiconductor manufacturing process and/or corresponding technology node. In one example, the DRC violations correspond to runset rules results.

To detect the DRC violations, the validation engine 110 compares the IC chip design to each of the DRC rules. A cell within the IC chip design may violate one or more of the DRC rules. In one example, the cells associated with identified DRC violations are additionally, or alternatively, communicated to the heatmap engine 120.

At block 230, a clustered heatmap is generated from the DRC violations. A heatmap is an error density map. In one example, one heatmap is generated from each DRC rule. In one example, a heatmap illustrates a corresponding DRC violation distribution across a corresponding IC design layout.

One or more processors (e.g. the processing device 802 of FIG. 8) of the heatmap engine 120 executes instructions (e.g., the instructions 826 of FIG. 8) stored in a non-transitory memory (e.g., the memory 140, the main memory 804 of FIG. 8, or the machine-readable medium 824 of FIG. 8) to perform block 230.

Figure 3:
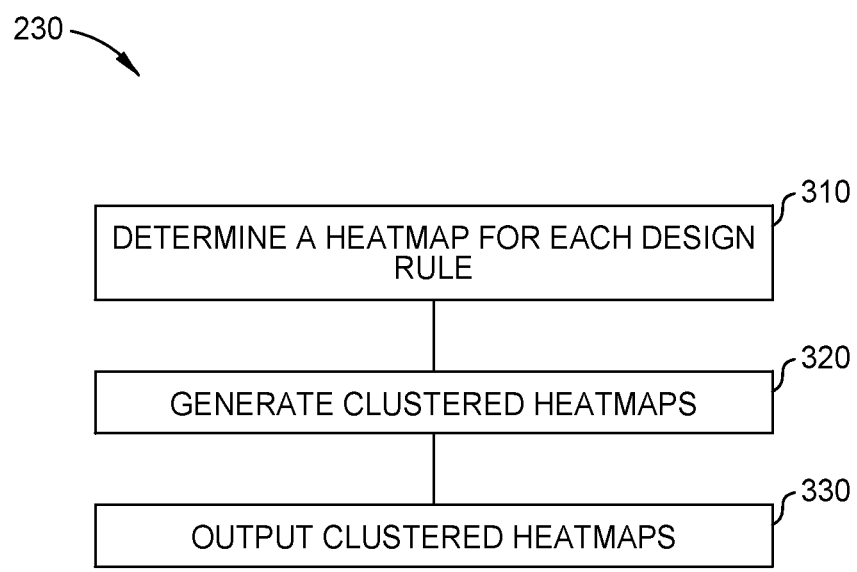
FIG. 3 depicts a flowchart of a method for generating a clustered heatmap, according to one or more examples.

FIG. 3 illustrates a flowchart of a method corresponding to the block 230 and for generating clustered heatmaps, according to one or more examples. The heatmap engine may additionally, or alternatively, receive the DRC violations from the validation engine 110.

At block 310, a heatmap for each design rule is determined. An IC design layout is divided into multiple grids and number of errors occurred for specific design rule are counted for each grid location in the layout. The higher the violation count, the hotter temperature (i.e. red color, black color, or larger number of dots (or other indicator)) is applied and lower the violation count, cooler temperature (i.e. blue color, whiter color, or smaller number of dots (or other indicator)) is applied, generating similarly to temperature map. In other examples, heatmap grid granularity are adjusted be coarser or finer. The heatmap engine 120 determines a heatmap (e.g., a DRC violation density matrix) for each design rule of the DRC. For example, the heatmap engine 120 determines DRC violation density matrix for each rule and generates a heatmap from each of DRC violation density matrix.

Figure 4:
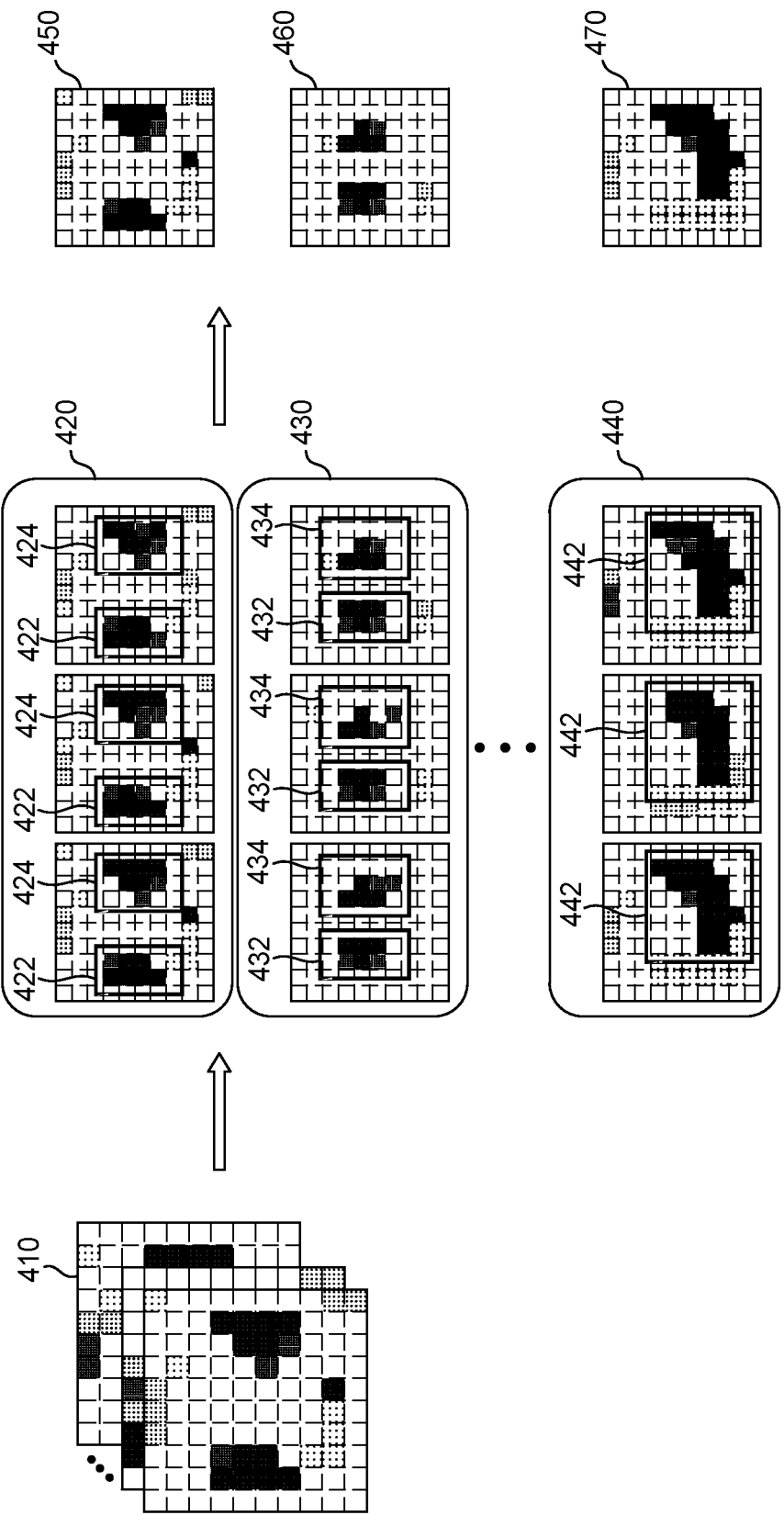
FIG. 4 depicts a flow diagram for generating clustered heatmaps, according to one or more examples.

FIG. 4 illustrates example heatmaps 410. A different heatmap 410 is generated for each identified DRC violation rule. The heatmaps 410 provide an indication as to densities (e.g., number) of the different DRC violations within different regions of a corresponding IC chip design. The heatmap engine 120 may divide the IC chip design into a plurality of regions (e.g., grid) to generate the heatmap. In one example, the number of regions is a hundred or more. The heatmap engine 120 generates the number of regions by dividing the area of the IC chip design into a plurality of regions equally. Each of the regions may have the same shape and size. In other example, the area of the IC chip design may be divided into a plurality of regions in an unequal manner such that at least one region is larger than another region. The heatmap engine 120 determines the number of the same DRC violations within each region. The heatmap engine 120 assigns an intensity to each region based on the determined number of DRC violations.

Different intensities within the heatmap correspond to the number of the DRC violations within each region of the IC chip design. In one example, different colors within the heatmap represent different densities of DRC violations. In another example, different intensities of the same color represent different densities of DRC violations. In one example, the different densities are represented by a number range with higher numbers representing higher densities (larger numbers) of DRC violations.

At block 320, clustered heatmaps are generated. The heatmap engine 120 generates clustered heatmaps by clustering the heatmaps having similar DRC violation distributions with the clustered model 122. For example, the heatmap engine 120 clusters heatmaps having DRC violations with a similar root cause using the clustered model 122. Clustering (grouping) the heatmaps may further include dividing the heatmaps into polygons associated with the DRC violations. In one example, grids with high violation count above certain threshold are the candidates to be considered for the heatmap polygon. Additionally, or alternatively, one or more grids with high violation count in neighboring locations are grouped to create heatmap polygon or region. The polygons (patterns or shapes) are formed from cells or heatmap grid that have one or more DRC violations. Similar polygons are polygons with the approximately same shape and size.

The clustered heatmaps identify DRC violations in a similar location with similar intensity within the IC design layout. Accordingly, the DRC violations of the clustered heatmaps may be considered to be part of the same root cause (e.g., error within the IC design layout) that violates multiple design rules. Types of common DRC violations include cell or block overlap, fill overlap, missing blockages, pad ring overlap, pin location mismatch and via overlap, as illustrated by FIG. 1B. One design error in the layout can violate multiple DRC rules. By grouping the DRC rules based on the error distribution (i.e. heatmap), the common root cause in the specific region in the layout may be identified. In one example, the clustering model 122 includes a clustering algorithm that is utilized to group heatmaps associated with DRC violations having a similar heatmap polygon, pattern, or shape, to generate clustered heatmaps. In one example, a K-means clustering algorithm is utilized to generate the clustered heatmaps. In other examples, other clustering algorithms are utilized.

With reference to FIG. 4, the heatmap engine 120 groups the DRC violations by clustering the heatmaps 410 using the clustering model 122. The clustered heatmaps 420, 430, and 440 are generated by clustering the heatmaps 410 using the clustering model 122. The heatmaps 410 are the input to the clustering model 122 and the output of the clustering model 122 is the clustered heatmaps 420, 430, and 440. In one example, the clustering model 122 analyzes the heatmaps 410 to identify similar polygons, shapes, and/or patterns within the heatmaps 410. The clustering model 122 uses a score (e.g., a silhouette score in K-means clustering) to determine the proximity between the heatmaps. The parameters (e.g., number of clusters) define the quality of clustering (i.e., how much do heatmaps in the same cluster look alike). Heatmaps in same cluster may not be equivalent, but general violation density in certain regions in the layout are relatively similar (e.g., similar intensities, shapes, and/or locations). Similar regions may have an intensity within twenty percent of each other. In other examples, similar regions may have intensities that differ more than about twenty percent from each other. Further, similar regions may have a shape that shares at least two polygons with a similar intensity in the same area. In one example, the heatmap engine 120 applies the clustering model 122 to the heatmaps 410 to form corresponding clustered heatmaps 420. The heatmap engine 120 applies the clustering model 122 to the heatmaps 410 to form corresponding clustered heatmaps 430. Further, the heatmap engine 120 applies the clustering model 122 to the heatmaps 410 to form corresponding clustered heatmaps 440. In one or more examples, the clusters with a single heatmap (i.e., a heatmap with unique distribution with no other violation rules with similar heatmap) are filtered out and not used for violation diagnostics.

With further reference to FIG. 3, at block 330, the clustered heatmaps are output. The heatmap engine 120 outputs the clustered heatmaps to the memory 140. Further, the heatmap engine 120 outputs the clustered heatmaps to the diagnostic engine 130.

With further reference to FIG. 2, at block 240, DRC violation types within the clustered heatmaps are detected. One or more processors (e.g., the processing device 802 of FIG. 8) of the diagnostic engine 130 executes instructions (e.g., the instructions 826 of FIG. 8) stored in a non-transitory memory (e.g., the memory 140, the main memory 804 of FIG. 8, or the machine-readable medium 824 of FIG. 8) to perform block 240. In one example, the diagnostic engine 130 analyzes the clustered heatmaps 420, 430, and 440 to identify one or more DRC violation types. The diagnostic engine 130 applies the diagnostic model 132 to the clustered heatmaps to identify the corresponding DRC violation types. In one example, the diagnostic model 132 is trained to identity a corresponding DRC violation type. For example, the diagnostic model 132 is trained and used by the diagnostic engine 130 to identify cell overlap violations, blockage violations, fill overlap violations, or via overlap violations, among others. The clustered heatmaps (e.g., the clustered heatmaps 420, 430, and/or 440), one or more parameters associated with DRC violation, and/or one or more parameters associated with the IC chip design are input to the diagnostic model 132 to identify which of the clustered heatmaps are associated with the DRC violation type.

The diagnostic engine 130 performs DRC violation determination by applying a classification algorithm associated with the diagnostic model 132. The diagnostic engine 130 may identify common or similar heatmap polygons with high violation count in each heatmap cluster to further diagnose the DRC violation types. The polygons (patterns or shapes) are formed from a heatmap grid that have one or more DRC violations. Similar polygons are polygons with the approximately same shape and size. The diagnostic engine 130 applies classifier to each clustered heatmap 420, 430, and 440 and/or clustered heatmap polygon/region 422, 424, 432, 434, and 442 to identify violations associated with the diagnostic model 132. In an example where the diagnostic model 132 is trained to detect cell overlap violations, the diagnostic engine 130 acquires cells associated with DRC violations. For example, the heatmap engine 120 accesses the memory 140 to acquire the cells associated with DRC violations. Then, the diagnostic engine 130 applies the diagnostic model 132 to the clustered heatmaps 420, 430, and 440 and/or clustered heatmap region 422, 424, 432, 434, and 442 to detect overlap area between cell pairs within each of the clustered heatmaps 420, 430, and 440 and/or clustered heatmap polygon/region 422, 424, 432, 434, and 442. In one example, heatmap polygon area and location, cell pair areas and locations, heatmap polygon to cell overlap percentage, number and types of DRC violation rules, among others are input features to the diagnostic model 132 and cell overlap violations are the binary label outputs within the output heatmaps 450, 460, or 470 and/or clustered heatmap polygon/region 422, 424, 432, 434, and 442.

In one example, the diagnostic model 132 is trained to detect cell overlap violations. In such an example, the diagnostic model 132 is applied to the clustered heatmaps to identify which of the clustered heatmap and/or heatmap polygon region correspond to cell overlap violations. With reference to FIG. 4, the diagnostic engine 130 applies the diagnostic model 132 to detect which of the clustered heatmaps 420, 430, and 440 and/or clustered heatmap region 422, 424, 432, 434, and 442 correspond to cell overlap violations. The diagnostic engine 130 identifies the clustered heatmap 440 as corresponding to cell overlap violations outputting clustered heatmap 470.

Figure 5:
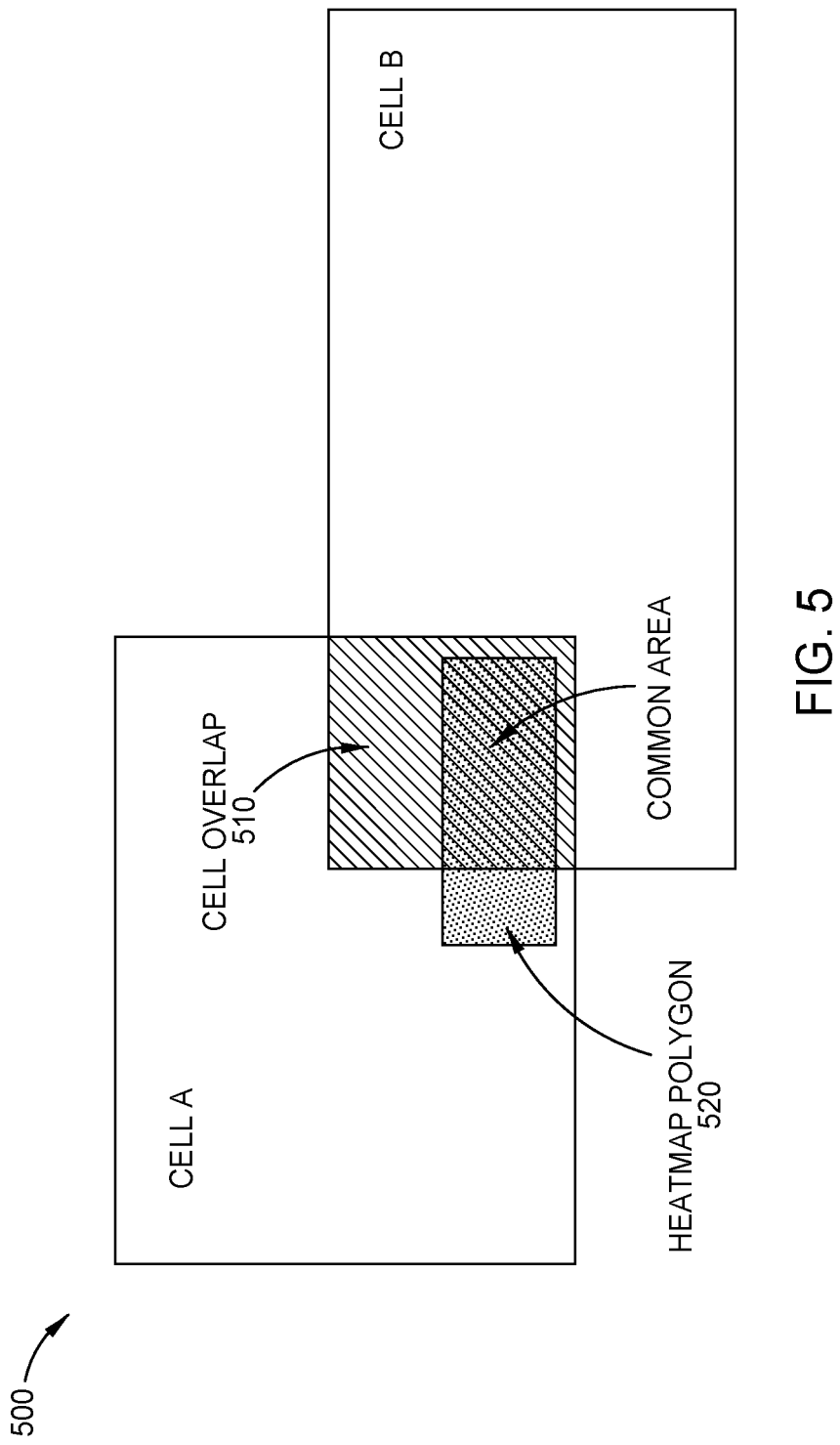
FIG. 5 depicts cell overlap between cells, according to one or more examples.

FIG. 5 illustrates a portion of example heatmap 500, according to one or more examples. The heatmap 500 indicates an overlap between two cell A and cell B, and a corresponding heatmap polygon region 520. A cell overlap violation is identified when a violation (e.g., error) exists in the overlap region 510 between cell A and cell B and the violation is at least partially caused by falsely placed cells creating more than minimum overlap. In other examples, similar concept can be applied to other components in the layout, such as fill, via and pad ring (e.g., the violation types of FIG. 1B). The diagnostic model 132 is applied to the heatmap 500 to determine whether or not a violation type exists in the overlap region 510.

Figure 6:
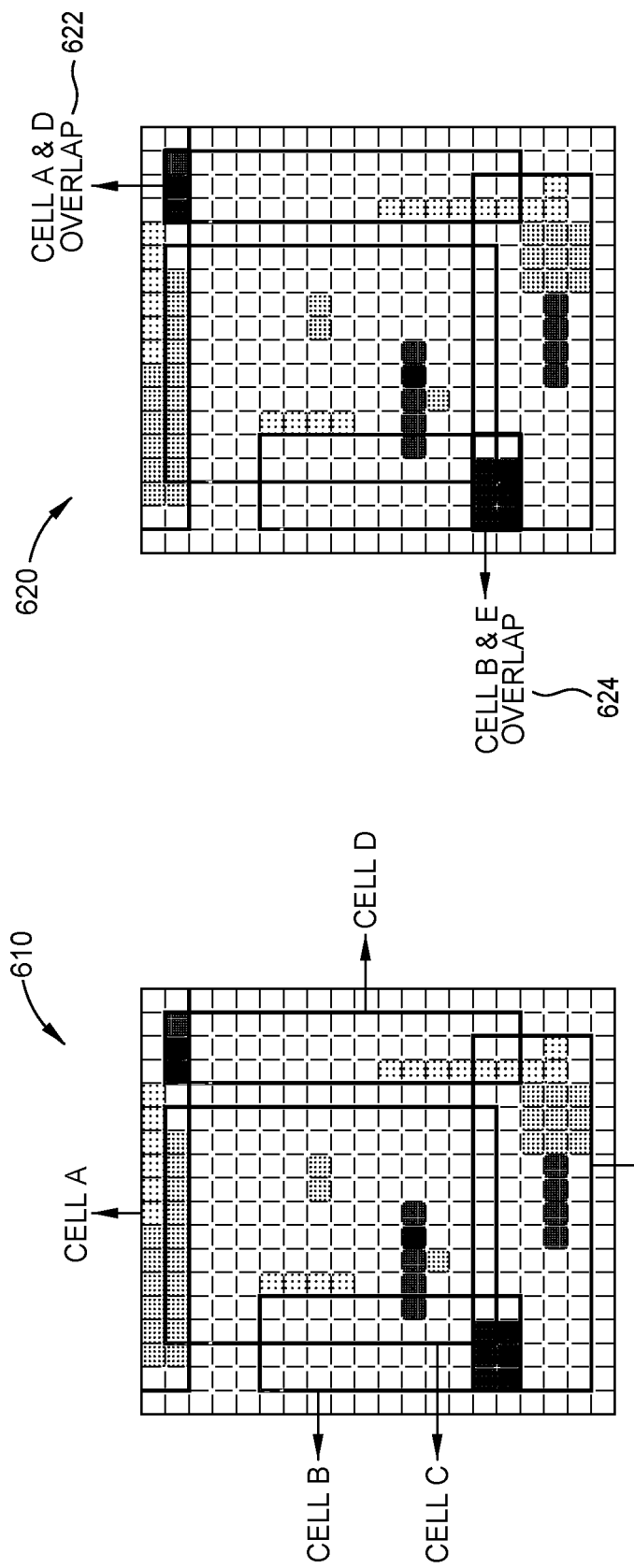
FIG. 6 depicts example cells and cell overlap violations, according to one or more examples.

FIG. 6 illustrates heatmap 610 having cell boundaries and violations and a heatmap 620 having cell overlap violations. The heatmap 610 illustrates violations within cell A, cell B, cell C, cell D, and cell E. The violation counts are indicated by the varying intensities within regions of the heatmap 610. Violations are present within each of the cells A, B, C, D, and E. Further, overlap is present between cell A and cell C, cell A and cell D, cell B and cell C, cell B and cell E, cell C and cell E, and cell D and cell E. Heatmap 620 indicates the cell overlap violations between the cells A, B, C, D, and E. The cell overlap violations are determined by the diagnostic engine 130 applying the diagnostic model 132 to the heatmap 610. Cell overlap violations 622 are detected in the overlap region between cell A and cell D, and cell overlap violations 624 are detected in the overlap region between cell B and cell E. The cell overlap violations 622 and 624 indicate errors correspond to cell overlap violations between cell A and cell D and cell B and cell E.

In another example, with reference to FIG. 4, the diagnostic model 132 is trained to identify a block violation (e.g., a missing blockage and/or a block blockage). In such an example, the diagnostic engine 130 applies the diagnostic model 132 to the clustered heatmaps 420, 430, and 440 and identifies the clustered heatmap 430 as corresponding to a blockage violation, outputting the clustered heatmap 460. In one example, the diagnostic model 132 is trained to identify via or fill overlap violation. In such an example, the diagnostic engine 130 applies the diagnostic model 132 to the clustered heatmaps 420, 430, and 440 and identifies the clustered heatmap 420 as corresponding to a blockage violation, outputting the clustered heatmap 450.

With further reference to FIG. 2, at block 250, the DRC violation types and corresponding cells (and/or components) are output. In one example, the diagnostic engine 130 saves the DRC violation type (or root cause) and corresponding cell pairs in the memory 140. Further, the DRC violation types and corresponding cells may be output to another computer system or engine of the error validation system 100. In one example, the diagnostic engine 130 outputs the names and coordinates of the cell pairs involved in overlap violation are output to an administrator for review. For example, the diagnostic engine 130 outputs the names and coordinates of cell pairs via a display device (e.g., a video display unit 810 illustrated in FIG. 8). Accordingly, instead of employing manual processes to review the DRC violations, the reported cell pairs causing the overlap violation are reviewed to fix the layout. The IC chip design may then be re-validated using the error validation system 100.

Figure 7:
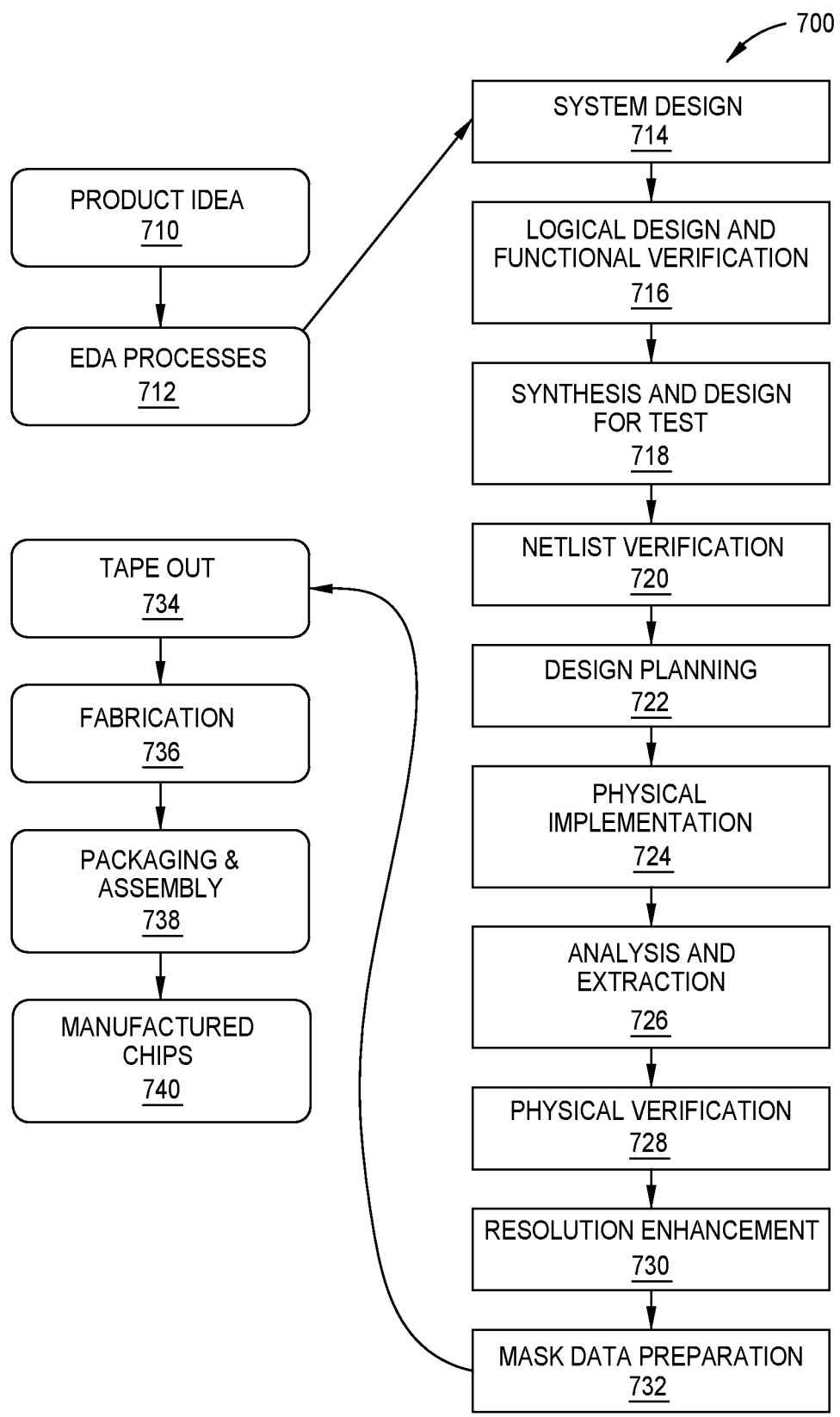
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8B) may be used to store the programs and data structures that are used by some or all of the EDA products described herein, and products used for development of cells for the library and for physical and logical design that use the library.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for identifying design rule checking (DRC) violation types within an integrated circuit (IC) chip design, the method comprising:
    receiving an IC chip design layout;
    performing a DRC process on the IC chip design layout to identify DRC violations;
    generating heatmaps for the DRC violations, wherein each of the DRC violations corresponds to a different one of the heatmaps;
    generating, by one or more processors, clustered heatmaps from the heatmaps generated for the DRC violations by combining two or more of the heatmaps that are associated with a first error within the IC chip design layout; and
    identifying, by the one or more processors, a first DRC violation type and a corresponding first cell pair within the IC chip design layout by analyzing the clustered heatmaps with a diagnostic model.

2. The method of claim 1, wherein the heatmaps indicate an error density distribution of a corresponding DRC violation of the DRC violations.

3. The method of claim 1, wherein the first DRC violation type is a cell overlap violation.

4. The method of claim 3, wherein identifying the first DRC violation type comprises:
    determining overlap between a first cell and a second cell of the IC chip design layout.

5. The method of claim 1, wherein generating the clustered heatmaps comprises:
    identifying a first heatmap of the heatmaps and a second heatmap of the heatmaps that have a similar polygon; and
    clustering the first heatmap and the second heatmap to generate the clustered heatmaps.

6. The method of claim 1, wherein analyzing the clustered heatmaps with the diagnostic model comprises identifying one or more heatmaps having a similar polygon.

7. The method of claim 1, wherein the diagnostic model is trained to identify a type of DRC violations associated with the first DRC violation.

8. A system comprising:
    a memory storing instructions; and
    a processor, coupled with the memory and to execute the instructions, the instructions when executed cause the processor to:
        receive an integrated circuit (IC) design layout;
        perform a DRC process on the IC design layout to identify DRC violations;
        generate heatmaps for the DRC violations, wherein each of the DRC violations corresponds to a different one of the heatmaps;
        generate clustered heatmaps from the heatmaps generated for the DRC violations by combining two or more of the heatmaps that are associated with a first error within the IC design layout; and
        identify a first DRC violation type and a corresponding first cell pair within the IC design layout by analyzing the clustered heatmaps with a diagnostic model.

9. The system of claim 8, wherein the heatmaps indicate an error density distribution of a DRC violation of the DRC violations.

10. The system of claim 8, wherein the first DRC violation type is a cell overlap violation.

11. The system of claim 10, wherein identifying the first DRC violation type comprises:
    determining overlap between a first cell and a second cell of the IC design layout.

12. The system of claim 8, wherein generating the clustered heatmaps comprises:
    identifying a first heatmap of the heatmaps and a second heatmap of the heatmaps that have a similar polygon; and
    clustering the first heatmap and the second heatmap to generate the clustered heatmaps.

13. The system of claim 8, wherein analyzing the clustered heatmaps with the diagnostic model comprises identifying one or more heatmaps having a similar polygon.

14. The system of claim 8, wherein the diagnostic model is trained to identify a type of DRC violations associated with the first DRC violation.

15. A non-transitory computer readable medium comprising stored instructions, which when executed by a processor, cause the processor to:
    receive an integrated circuit (IC) design layout;
    perform a design rule checking (DRC) process on the IC design layout to identify DRC violations;
    determine an error distribution across the IC design layout based on the DRC violations by combining error distributions associated with a first error within the IC design layout, the error distributions are generated for the DRC violations; and
    identify a first DRC violation type and a corresponding first cell pair within the IC design layout based on the error distribution across the IC design layout.

16. The non-transitory computer readable medium of claim 15, wherein the error distribution indicates an error density distribution of a DRC violation of the DRC violations.

17. The non-transitory computer readable medium of claim 15, wherein the first DRC violation type is a cell overlap violation.

18. The non-transitory computer readable medium of claim 17, wherein identifying the first DRC violation type comprises:
    determining overlap between a first cell and a second cell of the IC design layout.

19. The non-transitory computer readable medium of claim 15 the error distributions are represented as heatmaps, and the processor is further caused to generate clustered heatmaps by:
- identifying a first heatmap of the heatmaps and a second heatmap of the heatmaps that have a similar polygon; and
- clustering the first heatmap and the second heatmap to generate the clustered heatmaps, wherein the clustered heatmaps are analyzed with a diagnostic model to identify the first DRC violation type.

20. The non-transitory computer readable medium of claim 19, wherein analyzing the clustered heatmaps with the diagnostic model comprises identifying one or more heatmaps having a similar polygon.

* * * * *